(12) United States Patent
Chou et al.

(10) Patent No.: US 9,595,518 B1
(45) Date of Patent: Mar. 14, 2017

(54) FIN-TYPE METAL-SEMICONDUCTOR RESISTORS AND FABRICATION METHODS THEREOF

(71) Applicant: GLOBALFOUNDRIES INC., Grand Cayman (KY)

(72) Inventors: Anthony I-Chih Chou, Beacon, NY (US); Chengwen Pei, Danbury, CT (US); Edward P. Maciejewski, Wappingers Falls, NY (US); Ning Zhan, Scarsdale, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/969,449

(22) Filed: Dec. 15, 2015

(51) Int. Cl.
| | |
|---|---|
| *H01L 27/06* | (2006.01) |
| *H01L 21/8234* | (2006.01) |
| *H01L 21/265* | (2006.01) |
| *H01L 49/02* | (2006.01) |
| *H01L 29/08* | (2006.01) |

(Continued)

(52) U.S. Cl.
CPC .... *H01L 27/0629* (2013.01); *H01L 21/26513* (2013.01); *H01L 21/823418* (2013.01); *H01L 21/823431* (2013.01); *H01L 28/20* (2013.01); *H01L 29/0847* (2013.01); *H01L 29/456* (2013.01); *H01L 29/7851* (2013.01)

(58) Field of Classification Search
CPC ......... H01L 27/0629; H01L 21/823431; H01L 21/26513; H01L 29/456; H01L 29/7851; H01L 29/0847; H01L 21/823418; H01L 28/20

See application file for complete search history.

(56) References Cited

U.S. PATENT DOCUMENTS

| | | | |
|---|---|---|---|
| 4,104,607 | A | 8/1978 | Jones |
| 4,114,053 | A | 9/1978 | Turner |
| 4,229,753 | A | 10/1980 | Bergeron et al. |

(Continued)

FOREIGN PATENT DOCUMENTS

| | | |
|---|---|---|
| EP | 2207073 A2 | 7/2010 |
| JP | 5506798 B2 | 5/2014 |

(Continued)

*Primary Examiner* — Jessica Manno
*Assistant Examiner* — Mohammed R Alam
(74) *Attorney, Agent, or Firm* — Scully Scott Murphy and Presser; Frank Digiglio

(57) ABSTRACT

Fabrication methods and structure include: providing a wafer with at least one fin extended above a substrate in a first region, and at least one fin extended above the substrate in a second region of the wafer; forming a gate structure extending at least partially over the at least one fin to define a semiconductor device region in the first region; implanting a dopant into the at least one fin in the first region and into the at least one fin in the second region of the wafer, where the implanting of the dopant into the at least one fin of the second region modulates a physical property of the at least one fin to define a resistor device region in the second region; and disposing a conductive material at least partially over the at least one fin in the first region and over the at least one fin in the second region of the wafer, in part, to form a source and drain contact in the first region, and a fin-type metal-semiconductor resistor in the second region.

15 Claims, 6 Drawing Sheets

(51) Int. Cl.
   *H01L 29/45*  (2006.01)
   *H01L 29/78*  (2006.01)

(56) References Cited

U.S. PATENT DOCUMENTS

| | | |
|---|---|---|
| 4,464,646 A | 8/1984 | Burger et al. |
| 4,579,600 A | 4/1986 | Shah et al. |
| 4,803,457 A | 2/1989 | Chapel, Jr. et al. |
| 5,448,103 A | 9/1995 | de Wit |
| 6,011,386 A | 1/2000 | Li et al. |
| 6,306,718 B1 | 10/2001 | Singh et al. |
| 6,890,810 B2 | 5/2005 | Amadon et al. |
| 7,148,556 B2 | 12/2006 | Shaw et al. |
| 8,009,011 B2 | 8/2011 | Molin et al. |
| 8,188,832 B2 | 5/2012 | Das et al. |
| 8,525,637 B2 | 9/2013 | Smith et al. |
| 8,555,216 B2 | 10/2013 | Iben et al. |
| 2009/0002120 A1 | 1/2009 | Molin et al. |
| 2010/0013026 A1* | 1/2010 | Booth, Jr. ............... H01L 28/20 257/379 |
| 2013/0149849 A1 | 6/2013 | Nandekumar |
| 2013/0307076 A1* | 11/2013 | Cheng .................. H01L 21/845 257/350 |

FOREIGN PATENT DOCUMENTS

| | | |
|---|---|---|
| WO | 2013095632 A1 | 6/2013 |
| WO | 2015047294 A1 | 4/2015 |

* cited by examiner

FIN-TYPE METAL-SEMICONDUCTOR RESISTORS AND FABRICATION METHODS THEREOF

FIELD OF THE INVENTION

The present invention relates to fin-type transistor structures and to methods for fabricating fin-type transistors, and more particularly to fin-type metal-semiconductor resistors and fabrication methods thereof.

BACKGROUND

Fin-type field-effect transistor (FinFET) devices continue to be developed to replace traditional planar metal-oxide-semiconductors, field-effect transistors (MOSFETs), in advanced complementary metal oxide semiconductor (CMOS) technology, due to their improved short-channel effect immunity and higher on-current to off-current ratio ($I_{on}/I_{off}$). As the integration density of transistors continues to increase, the footprint area occupied by individual transistors continues to decrease. The ever-decreasing transistor size continues to demand fin size scaling which, for instance, renders it difficult to fabricate resistors with compatible process flow. It is critical to fabricate resistors with enhanced performance characteristics within an integrated circuit along with the compatible process flow.

Accordingly, a need exists for enhanced fin-type resistors and processes for fabrication of fin-type resistors within integrated circuits so as to provide enhanced performance.

BRIEF SUMMARY

Certain shortcomings of the prior art are overcome and additional advantages are provided through the provision, in one aspect, of a method, for instance, including: providing a wafer with at least one fin extended above a substrate in a first region, and at least one fin extended above the substrate in a second region of the wafer; forming a gate structure extending at least partially over the at least one fin in the first region to define a semiconductor device region in the first region; implanting a dopant into the at least one fin in the first region and into the at least one fin in the second region of the wafer, wherein the implanting of the dopant into the at least one fin of the second region modulates a physical property of the at least one fin to define a resistor device region in the second region; and disposing a conductive material at least partially over the at least one fin in the first region and over the at least one fin in the second region of the wafer, in part, to form a source and drain contact in the first region, and a fin-type metal-semiconductor resistor in the second region of the wafer.

In a further aspect, a structure is provided which, for instance, includes: at least one fin extended above a substrate in a first region and at least one fin extended above the substrate in a second region of a wafer; a gate structure extending at least partially over the at least one fin in the first region defining a semiconductor device region in the first region; and a conductive material disposed at least partially over the at least one fin in the first region and over the at least one fin in the second region of the wafer, the conductive material being, in part, a source and drain contact in the first region, and a fin-type metal-semiconductor resistor in the second region of the wafer.

Additional features and advantages are realized through the techniques of the present invention. Other embodiments and aspects of the invention are described in detail herein and are considered a part of the claimed invention.

BRIEF DESCRIPTION OF THE SEVERAL VIEWS OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

DETAILED DESCRIPTION

Figure 1A:
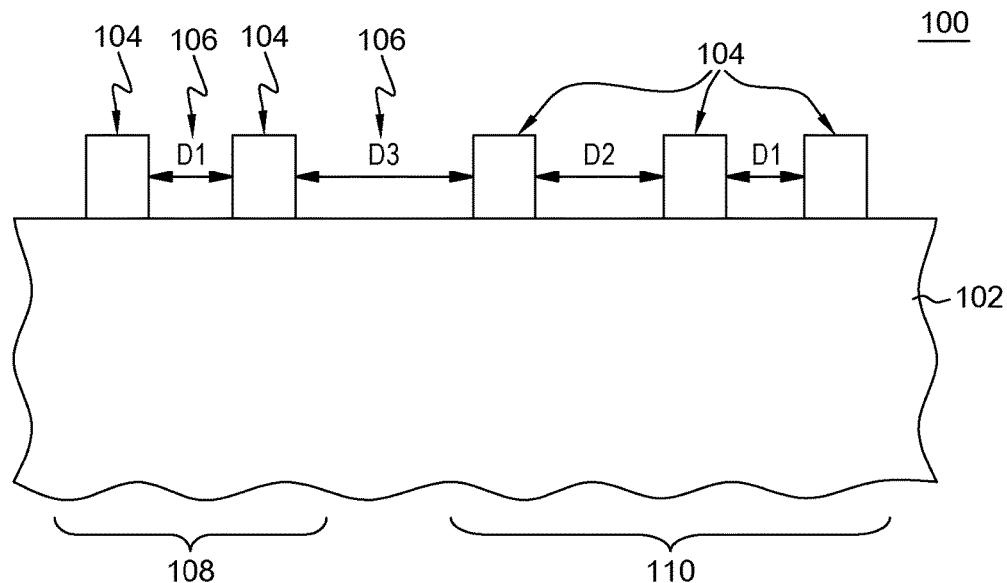
FIG. 1A depicts a cross-sectional elevational view of an intermediate structure, obtained during a fin-type transistor fabrication process, and illustrates one or more fins extended above a substrate of a wafer, in accordance with one or more aspects of the present invention.

Aspects of the present invention and certain features, advantages, and details thereof, are explained more fully below with reference to the non-limiting examples illustrated in the accompanying drawings. Descriptions of well-known materials, fabrication tools, processing techniques, etc., are omitted so as not to unnecessarily obscure the invention in details. It should be understood, however, that the detailed description and the specific examples, while indicating embodiments of the invention, are given by way of illustration only, and not by way of limitation. Various substitutions, modifications, additions and/or arrangements within the spirit and/or scope of the underlying inventive concepts will be apparent to those skilled in the art from this disclosure.

The present disclosure provides, in part, a fin-type metal-semiconductor resistor with, for instance, a resistance that can be modulated (also referred to as "tunable resistance") and having a substantially zero "0" temperature coefficient of resistivity (TCR) and methods for fabrication thereof. In one aspect, in operation of semiconductor integrated circuits, a resistor may be typically employed to control the resistance of various electrical components of the integrated circuits. For instance, doped polysilicon materials are employed as resistors in conventional planar MOSFETs to tune the resistance of various components of the semiconductor devices. Disadvantageously, such polysilicon resistors can only provide a limited resistance within a limited space. Consequently, as the semiconductor device fabrication processing transitions to 14 nm and beyond technology nodes, for instance, as in fin-type transistor devices, these polysilicon resistors are replaced by materials having a higher resistivity than that of the traditional polysilicon. In one example, these materials with higher resistivity may be, or include metals such as, titanium nitride (TiN) or tantalum nitride (TaN). Disadvantageously, such materials typically tend to exhibit a higher temperature coefficient of resistivity which, for instance, may interfere with the performance of high-performance semiconductor devices. Additionally, the fabrication of such metal resistors typically involves additional fabrication processing techniques using a series of masks and patterning steps which may lead to reduced yield and overall fabrication costs.

Generally stated, disclosed herein, in one aspect is a method which, for instance, includes: providing a wafer with at least one fin extended above a substrate in a first region and at least one fin extended above the substrate in a second region of the wafer; forming a gate structure extending at least partially over the at least one fin in the first region to define a semiconductor device region in the first region; implanting a dopant into the at least one fin in the first region and into the at least one fin in the second region of the wafer, where such implanting of the dopant into the at least one fin in the second region modulates a physical property of the at least one fin to define a resistor device region in the second region; and disposing a conductive material at least partially over the at least one fin in the first region and over the at least one fin in the second region of the wafer, in part, to form a source and drain contact in the first region, and a fin-type metal-semiconductor resistor in the second region of the wafer.

In one embodiment, the gate structure may be formed extending at least partially over the at least one fin in the first region, prior to the implantation of the dopant to define the resistor device region. For instance, the implanting the dopant may include implantation of the dopant into the at least one fin in the first region to define a well dopant in the first region, while implantation of the dopant into the at least one fin in the second region defines a resistor dopant in the second region of the wafer. In one aspect, the physical property of the at least one fin in the second region may include a resistivity of the at least one fin in the second region, with the resistivity of the at least one fin of the second region being a function of the dopant implanted into the at least one fin in the second region of the wafer.

In another embodiment, the fabrication method may include epitaxially growing a semiconductor material to form a source and drain region in the first region, and to form an epitaxial semiconductor structure in the second region of the wafer. In this embodiment, the implanting may include implantation of the dopant into the at least one fin in the second region of the wafer, subsequent to the epitaxial growth of the epitaxial semiconductor structure, to modulate the physical property of the at least one fin in the second region of the wafer. For instance, the implanting the dopant may include implantation of the dopant into the at least one fin in the first region to define a source and drain dopant in the first region, and implantation of the dopant into the at least one fin in the second region to define a resistor dopant in the second region.

In yet another embodiment, the implanting of the dopant into the at least one fin in the second region may include performing a first implantation and a second implantation into the at least one fin in the second region, with the first implantation being performed subsequent to defining the semiconductor device region of the first region, and the second implantation being performed subsequent to forming an epitaxial semiconductor structure in the second region of the wafer.

Further, in an enhanced embodiment, the physical property of the at least one fin in the second region may include a temperature coefficient of resistivity, with the temperature coefficient of resistivity of the at least one fin in the second region being a function of the dopant implanted within the at least one fin in the second region. For instance, the conductive material disposed over the at least one fin in the second region may have a first temperature coefficient of resistivity, and the at least one fin, upon implantation of the dopant, may have a second temperature coefficient of resistivity, with the first and the second coefficients of resistivity being different temperature coefficients of resistivity. In such an example, the dopant being implanted into the at least one fin in the second region may modulate an effective temperature coefficient of resistivity to be substantially 0 ppm/° C. In one example, the conductive material may reside over and in electrical contact with a silicide, with the silicide residing over or including part of an epitaxial semiconductor structure disposed over the at least one fin in the second region. In one example, the epitaxial semiconductor structure may include an isolated epitaxial semiconductor structure over the at least one fin in the second region, with the silicide being formed over the epitaxial semiconductor structure along a length thereof defining a fin-type metal resistor in the second region of the wafer. In another example, the epitaxial semiconductor structure may include at least a partially merged epitaxial semiconductor structure over the at least one fin in the second region, with the silicide being formed, at least in part, over the at least partially merged epitaxial semiconductor structure in the second region of the wafer defining a fin-type semiconductor resistor in the second region of the wafer. The dopant may include at least one of an n-type dopant such as, for example, boron, aluminum etc., or a p-type dopant such as, for example, phosphorus, where a concentration of the dopant within the at least one fin may be within a range of about 1E16 atom/cm$^3$ to 1E20 atom/cm$^3$.

Reference is made below to the drawings, which are not drawn to scale for ease of understanding, wherein the same reference numbers used throughout different figures designate the same or similar components.

By way of example, FIGS. 1A-1J depict one detailed embodiment of a structure and a method for fabricating fin-type metal-semiconductor resistor(s) disposed over a wafer. Advantageously, as described below, the fin-type metal-semiconductor resistor(s) facilitate providing tunable resistance and may have substantially zero "0" temperature coefficient of resistivity (TCR), in accordance with one or more aspects of the present invention. Additionally, the fabrication method herein also includes integrating fin-type metal-semiconductor resistor(s) herein with a conventional fin-type fabrication processing, thereby resulting in a cost-effective fabrication processing.

FIG. 1A depicts a cross-sectional elevational view of an intermediate structure obtained during a fin-type transistor fabrication process, which includes, for instance, a substrate 102 of wafer 100. Substrate 102 may be, for example, a bulk semiconductor material, such as a bulk silicon wafer. In another example, substrate 102 may be any silicon-containing substrate including, but not limited to, silicon (Si), single crystal silicon (Si), polycrystalline Si, amorphous Si or the like. Although not depicted in figures, substrate 102 may further include a layered semiconductor structure such as, for example, silicon-on-nothing (SON), silicon-on-insulator (SOI), silicon germanium-on-insulator (SiGeOI), germanium-on-insulator (GOI), silicon-on replacement insulator (SRI) or the like. Substrate 102 may in addition or instead include various isolation structures or regions, dopant regions and/or device features. Further, substrate 102 may also include other suitable elementary semiconductors, such as, for instance, germanium (Ge), or a compound semiconductor such as, silicon germanium (SiGe), SiC, SiGeC, gallium arsenide (GaAs), gallium phosphide (GaP), gallium nitride (GaN), indium arsenide (InAs), indium phosphide (InP), and/or all other III/V or II/VI compound semiconductors.

Continuing with FIG. 1A, one or more fin structures (referred to herein as fins) 104 may be patterned extending from substrate 102. For instance, fins 104 may be formed by patterning substrate 102 using any of various approaches including: direct lithography; sidewall image transfer technique; extreme ultraviolet technique (EUV); e-beam technique; litho-etch litho-etch or litho-etch litho-freeze. Following patterning, additional etching processes, such as anisotropic dry etching processes, may be performed to remove one or more portions of the substrate. In one example, adjacent fins 104 may be separated by a respective opening 106. Although evenly spaced fins with substantially similar dimensions are expected after a conventional patterning processing, in one implementation, the distance between two adjacent fins may also be varied, depending upon the various process parameters employed. As illustrated, while two adjacent fins may be evenly spaced apart a distance "D1", the distance between adjacent fins may also be varied by distances "D2" and "D3". As described further below, these variations in distances between the fins facilitates defining one or more regions, for example, region 108 and region 110 on substrate 102 of the wafer. Additionally, these variations in distances between the fins may also be utilized to fabricate fin-type metal-semiconductor resistors with varying dimensions, depending upon the performance of desired electrical components of the resultant integrated circuits.

Figure 1B:
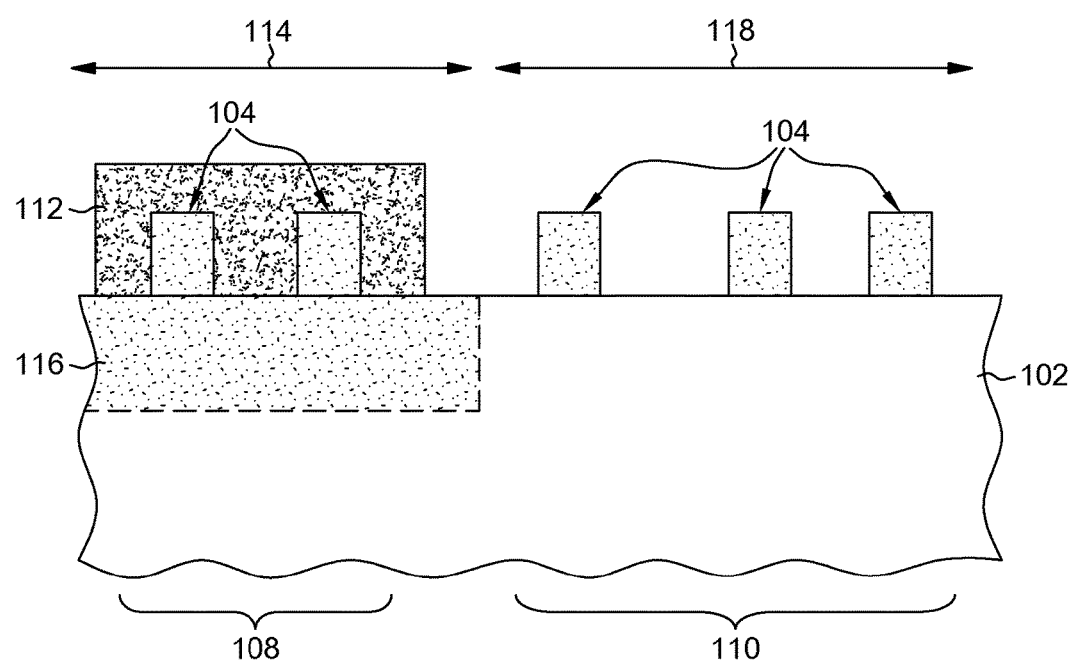
FIG. 1B depicts the intermediate structure of FIG. 1A after providing a gate structure extending at least partially over the fin(s) in a first region of the wafer, in accordance with one or more aspects of the present invention.

FIG. 1B depicts the structure of FIG. 1A, after providing gate structure 112 extending at least partially over the fins 104 in region 108 of the wafer. As one skilled in the art will understand, a gate material may be provided over one or more layers (not shown), such as, for instance, a gate dielectric layer and/or work function layer to form gate structure 112. This gate structure 112 may extend over fins 104, and may overlap fins 104 in selected areas to operate as, for instance, the gate of a fin-type transistor, thereby defining a semiconductor device region 114 in region 108 of the wafer. As used herein, "semiconductor device region" refers to a region or an area on the substrate of the wafer, upon which one or more semiconductor devices, such as, fin-type transistors can be fabricated. In one example, the gate material may include or be fabricated of a metal, and be formed as a part of a gate-first fabrication process. Alternatively, in another example, the gate material may include or be fabricated of a sacrificial gate material, such as an amorphous silicon (a-Si) or polycrystalline silicon (polysilicon), which may subsequently be replaced with a replacement gate material, as part of a gate-last fabrication process.

Continuing with FIG. 1B, fins 104 may be implanted with one or more dopants using one or more conventional implantation processes. For instance, the dopants may be or include a p-type dopant or an n-type dopant. As used herein, "p-type dopant" refers to the addition of an impurity to fins 104 (including, for instance, an intrinsic semiconductor material) to create deficiencies of valence electrons, and may include, for instance, boron, aluminum, gallium or indium. Similarly, as used herein, "n-type dopant" refers to the addition of impurities to fins 104 (including, for instance, an intrinsic semiconductor material), which contribute more electrons to the intrinsic material, and may include, for instance, phosphorus, antimony or arsenic.

In one embodiment of the present invention, fins 104 in region 108 may be implanted with dopants resulting in creating a well region 116 within fins 104 which, for instance, extends into a portion of substrate 102 in region 108 of the wafer. The dopants being implanted to create well region 116, in turn, are defined herein as well dopants. By contrast, upon implantation, the dopants being implanted into fins 104 in region 110 facilitate modulating or tuning a physical property, such as, resistivity (for instance, of a material) of fins 104 in region 110; thereby defining a resistor device region 118 in region 110 of the wafer. Consequently, the dopants being implanted into fins 104 in region 110 are referred to herein as "resistor dopants". Further, as used herein, "resistor device region" refers to a region or an area on the substrate of a wafer, upon which a resultant resistor can be fabricated to control the resistance of various electrical components of the integrated circuits. As noted, these resistor dopants being implanted into fins 104 of region 110 may be the same or substantially similar to the well dopants being implanted into fins 104 of region 108.

Additionally, the ion (i.e. resistor dopant) implantation process may be performed by controlling parameters such as, for instance, implantation dose, implantation energy, implantation acceleration, so as to modulate the concentration of dopants being implanted into the fins, thereby modulating the desired resistivity (for instance, of a material) of the fins 104 in region 110. These controlled process parameters, for instance, result in defining the total resistivity of fins 104 in region 110 as a function of the concentration of the dopants (for instance, resistor dopants) being implanted into fin(s) 104 in region 110. For instance, the resistivity of the fins in region 110 may be increased by increasing the concentration of dopants (e.g., resistor dopants) within the fins. As used herein, "function" refers to a relationship between concentrations of the dopant being implanted within the fins and the total resistivity of the fins. Further, in one example, the controlled process parameters employed during the implantation of the resistor dopant may be coupled with the process parameters employed during the implantation of the well dopant. This coupling of process parameters, advantageously, facilitates achieving well region 116 with a desired depth extending into substrate 102 in region 108, while simultaneously modulating or tuning a desired resistivity of fins 104 in region 110 of the wafer. In another example, each of the process parameters employed during the implantation of the resistor dopant and well dopants can be controlled independently by using a series of masks to selectively expose either the semiconductor device region 114 or resistor device region 118, as desired. In yet another example, fins 104 in region 110 may be implanted with resistor dopants to modulate the resistivity (for instance, of a material) of fins 104 by using a series of masks and processing steps, without implanting the well dopants into fins 104 in region 108 of the wafer.

Additionally, the dopants, in particular, resistor dopants, implanted within fins 104 also define a temperature coefficient of resistivity (for instance, of a material) of fins 104. For instance, the temperature coefficient of resistivity of fins 104 in region 110 may also be a function of the dopants implanted within fins 104 in region 110 of wafer 100. In such an example, the temperature coefficient of resistivity of fins 104 in region 110 may increase with an increase in concentration of dopants (for instance, resistor dopants) within fins 104 of region 110 or vice versa.

In one example, fins 104 may be implanted with dopants, such as, p-type well dopants or p-type resistor dopants (e.g., boron or a compound of boron) by employing an implantation dose of about 1E17 atom/cm$^2$ to about 1E20 atom/cm$^2$, with an implantation energy of about 2 keV to about 10 keV, to provide a desired concentration of p-type well dopant within fins 104 in region 108, and a desired concentration of p-type resistor dopants within fins 104 in region 110. In a specific example, the concentration of p-type dopants within fins 104 in regions 108 and 110 may be within a range of about 1E16 atom/cm$^3$ to about 1E20 atom/cm$^3$. Similarly, in another example, fins 104 may also be implanted with n-type dopants such as phosphorus or a compound of phosphorus to provide a desired concentration of n-type dopants within fins 104 in regions 108 and 110. In such an example, fins 104 may be implanted with n-type dopants, by employing an implantation dose of about 1E17 atom/cm$^2$ to about 1E20 atom/cm$^2$, with an implantation energy of about 5 keV to about 20 keV, to provide the desired concentration of about 1E17 atom/cm$^3$ to about 1E20 atom/cm$^3$ of n-type dopants within fins 104.

Figure 1C:
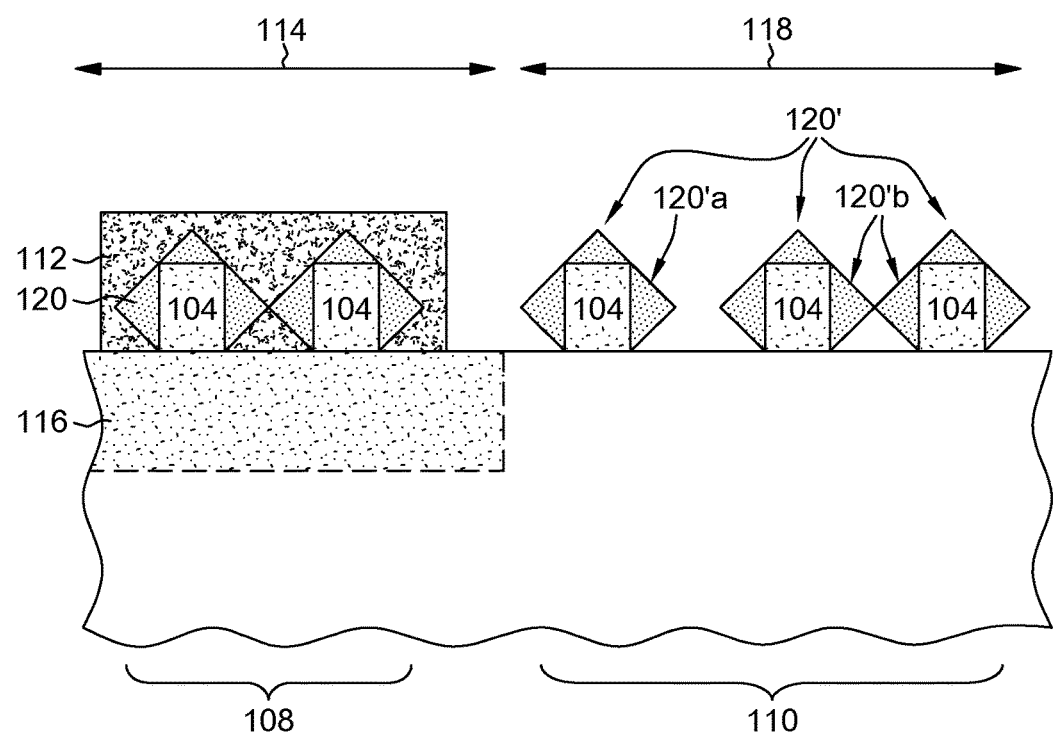
FIG. 1C depicts the intermediate structure of FIG. 1B, with epitaxially grown source and drain regions in the first region, and an epitaxial semiconductor structure in a second region of the wafer, in accordance with one or more aspects of the present invention.

FIG. 1C depicts the structure of FIG. 1B, after epitaxially growing a semiconductor material over fin(s) 104 to form a source and drain region 120 in region 108, and to form an epitaxial semiconductor structure 120' in region 110. As used herein, "epitaxially growing/growth" refers to growing a semiconductor material over a surface of another semiconductor material such as, a semiconductor fin material, in which the semiconductor material being grown has same crystalline characteristics of the semiconductor fin material. By way of example, source and drain regions 120 may be formed, for instance, by epitaxially growing a semiconductor material over a portion of fins 104, not covered by gate structure 112. In one example, a semiconductor material may be, or include a silicon-containing material such as, for instance, silicon, silicon germanium, silicon carbide or the like. As one skilled in the art will understand that, owing to difference in growth rates of different crystallographic orientations, the epitaxial growth of the semiconductor material may define the shape of the source and drain regions of fin-type transistors resulting, for instance, in shaped-structures such as, for instance, diamond-shaped structures. For instance, the epitaxial growth rate on the silicon (Si) surface having (111) crystallographic orientation may be slower than that on other crystallographic orientations such as, (100) or (110) orientations. This, in turn, may result in a diamond-shape of source and drain region 120.

Similarly, the epitaxial growth of the semiconductor material over fins 104 results in an epitaxial semiconductor structure 120' in region 110 of wafer 100. As described above, the difference in growth rates of different crystallographic surfaces may also define the shape of epitaxial semiconductor structure 120' resulting, for instance, in a diamond-shaped epitaxial semiconductor structure 120' in region 110. Furthermore, as illustrated, the varying distances (for instance, distances D1 and D2 (FIG. 1A)) between adjacent fins 104 in region 110 may, advantageously, result in forming either an isolated epitaxial semiconductor structure 120'a or a merged epitaxial semiconductor structure 120'b.

As one skilled in the art will understand, in one example, assuming that the semiconductor material is a silicon material, the source and drain region 120 of region 108 and epitaxial semiconductor structure 120' of region 110 may be formed, for instance, using a silicon gas source such as, silane (SiH$_4$), trichlorosilane (Cl$_3$SiH), dimethylsilane ((CH$_3$)$_2$SiH$_2$) or the like. In another example, the semiconductor material to be epitaxially grown over fins 104 may be or include a silicon germanium. In such an example, the source and drain region 120 of region 108 and epitaxial semiconductor structure 120' of region may be formed using a silicon gas source such as, silane (SiH$_4$), disilane, trisilane, tetrasilane, hexachlorosilane or the like, along with a germanium gas source, such as, for example, germane, digermane, halogermane, dichlorogermane, trichlorogermane or the like. In yet another example, the semiconductor material may also be or include germanium material which may be formed using a germanium gas source, such as, for example, germane, digermane, halogermane, dichlorogermane, trichlorogermane or the like.

Figure 1D:
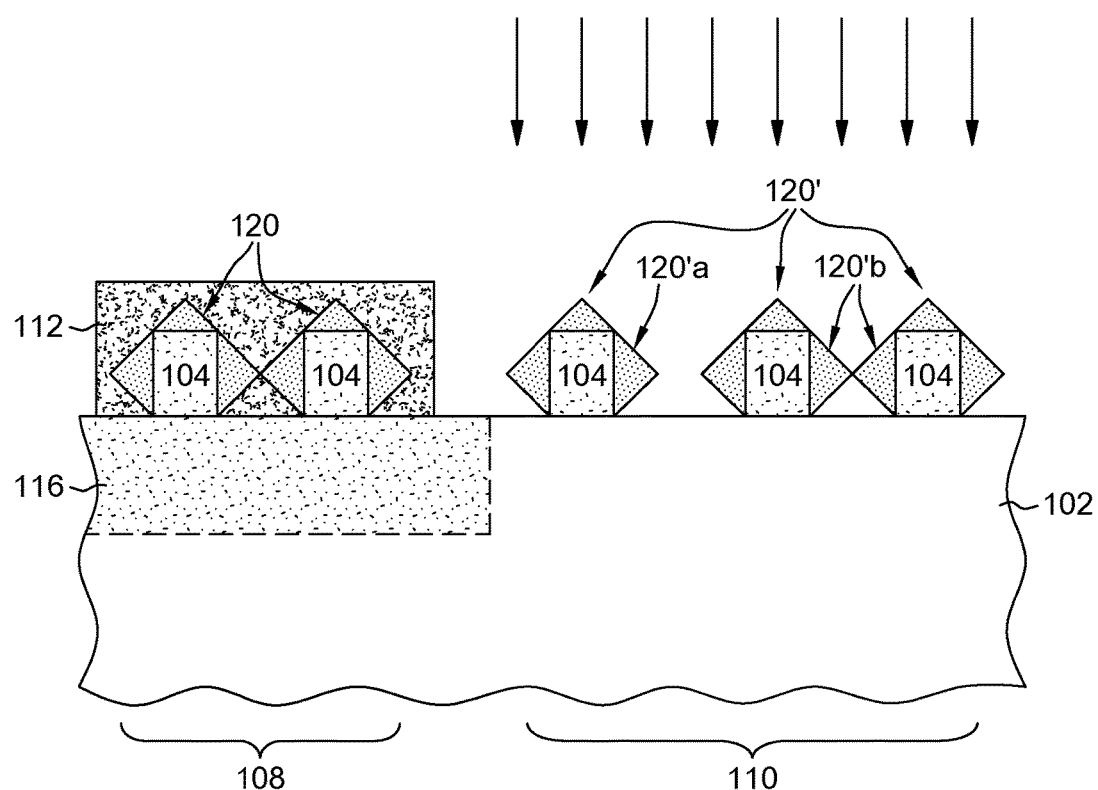
FIG. 1D depicts the intermediate structure of FIG. 1C, after an additional implantation process, for instance, to further modulate resistivity of the fin(s) in the second region of the wafer, in accordance with one or more aspects of the present invention.

As depicted in FIG. 1D, an additional ion implantation process may be performed over fins 104 using one or more conventional implantation processes, for instance, to activate source and drain region 120 in region 108, and to further modulate or tune a physical property such as, for instance, resistivity (for instance, of a material) of fins 104 in region 110 respectively. This additional ion implantation process may be performed in addition to or instead of the ion implantation process described in connection with FIG. 1B, and may be accomplished using the dopants and/or process parameters described above. For instance, as described above, source and drain region 120 of fins 104 in region 108, and epitaxial semiconductor structure(s) 120' of fins 104 in region 110 may be implanted with the dopants which may be or include at least one of an n-type dopant (e.g., phosphorus, antimony or arsenic) or a p-type dopant (e.g., boron, aluminum, gallium or indium). In this embodiment, the dopants which facilitate activating the source and drain region 120 in region 108 are defined herein as "source and drain dopants", while the dopants which further modulate the resistivity of fins 104 in region 110 are defined herein as the "resistor dopants". As described above, the source and drain dopants being implanted into fins 104 in region 108 may be the same or substantially similar to the resistor dopants being implanted into fins 108 in region 110 of wafer 100. Additionally, as described above, the ion implantation process may be performed by controlling parameters such as, for instance, implantation dose, implantation energy, implantation acceleration, so as to modulate the concentration of dopants, in particular, resistor dopants within the fins in region 110; thereby modulating the desired resistivity of fin(s) 104 in region 110. Further, as described above, the dopants, in particular, resistor dopants, implanted within fins 104 may also define the temperature coefficient of resistivity (for instance, of a material) of fins 104, the temperature coefficient of resistivity of fins in region 110 being a function of the dopants implanted within the fins 104 in region 110 of wafer 100.

Figure 1E:
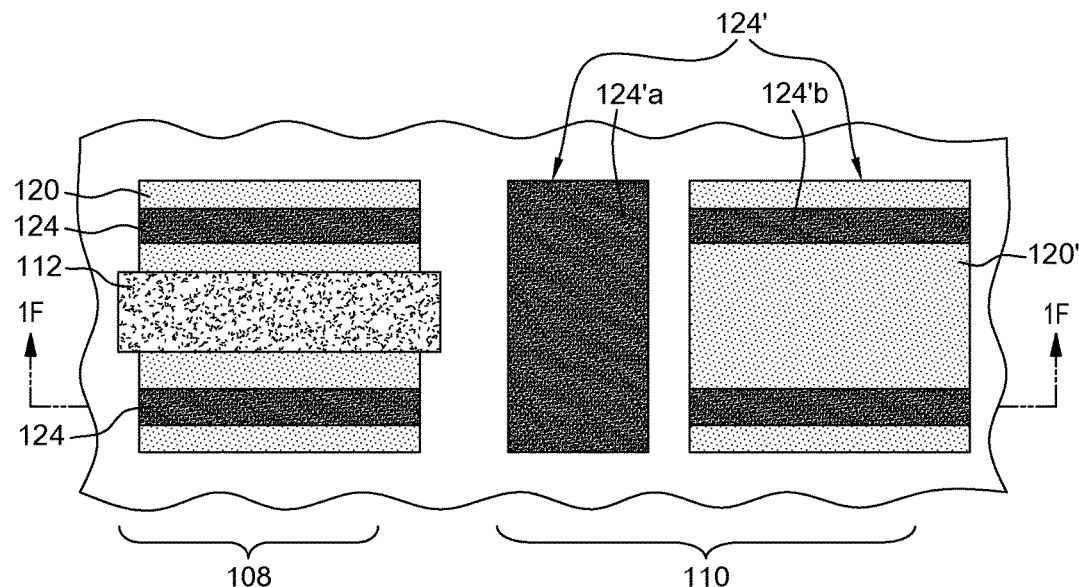
FIG. 1E depicts a plan view of the intermediate structure of FIG. 1D, after forming a silicide over the source and drain regions of the first region, and over the epitaxial semiconductor structure of the second region, in accordance with one or more aspects of the present invention.

FIG. 1E depicts a plan view of the intermediate structure of FIG. 1D, after forming a silicide 124 over the source and drain region 120 of region 108 and silicide 124' over epitaxial semiconductor structure 120' of region 110 of wafer 100 respectively, thereby defining a part of the source and drain region and/or the epitaxial semiconductor structure. The silicide may be formed using a metal such as, cobalt, nickel, titanium, tantalum, platinum, palladium, rhodium and combinations thereof, that has been chemically reacted with the semiconductor material (such as, for example, silicon) of source and drain region 120 of region 108 and epitaxial semiconductor structure 120' of region 110, respectively. As illustrated, silicide 124 may be formed at least partially over source and drain 120 in region 108, while the location of silicide 124' over epitaxial semiconductor structure 120' may vary, depending upon the epitaxial semiconductor structure being an isolated or merged epitaxial semiconductor structures. For instance, while the silicide 124'a may be formed along an entire length of an isolated epitaxial semiconductor structure 120'a (see FIG. 1D), the merged epitaxial semiconductor structure 120'b (see FIG. 1D) results in silicide 124'b being formed at least partially (for instance, at opposite ends) thereover. In such an example, where the silicide is formed on the entire fin, the physical properties such as, resistivity and/or temperature coefficient of resistivity may be dominated by the silicide 124'a of the isolated epitaxial semiconductor structure 120'a (see FIG. 1D) defining a fin-type metal resistor. By contrast, in another example, where the silicide is formed at opposite ends of the epitaxial semiconductor structure 120'b, the physical properties (for instance, resistivity and/or temperature coefficient of resistivity) may be dominated the doped semiconductor fin material defining the fin-type semiconductor resistor. These two resistors can subsequently be connected in series or in parallel so as to provide the desired resistivity and/or temperature coefficient of resistivity in region 110 of wafer 100.

Figure 1F:
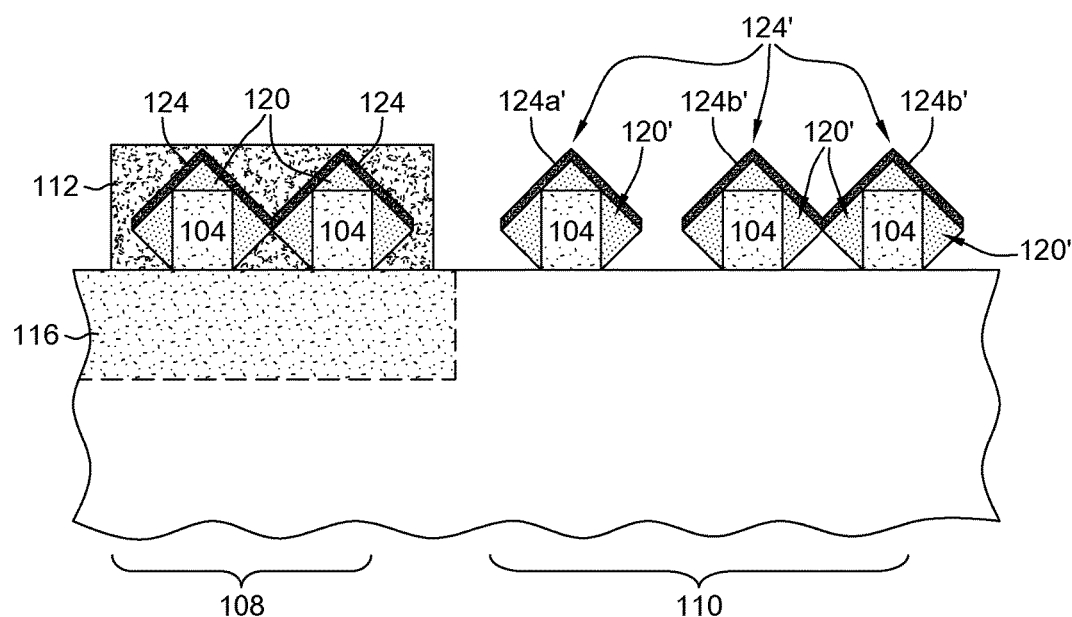
FIG. 1F depicts the intermediate structure of FIG. 1E, taken along line 1F-1F thereof, in accordance with one or more aspects of the present invention

FIG. 1F illustrates a cross-sectional view of the intermediate structure of FIG. 1E, taken along line 1F-1F thereof, and showing silicide 124 disposed at least partially over source and drain 120 of region 108, and silicide 124' disposed over epitaxial semiconductor structure 120' of region 110.

Figure 1G:
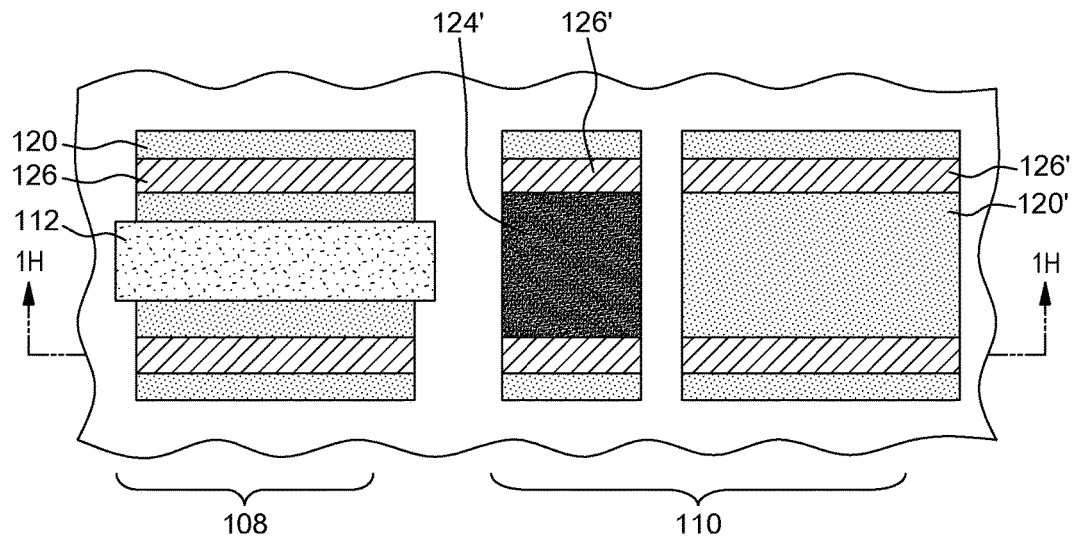
FIG. 1G depicts a plan view of the intermediate structure of FIG. 1F, after forming a source and drain contact in the first region, and a fin-type metal-semiconductor resistor in the second region, in accordance with one or more aspects of the present invention

FIG. 1G depicts a plan view of the structure of FIG. 1F, after forming source and drain contact 126 in region 108 and fin-type metal-semiconductor resistor 126' in region 110 of the wafer 100. As illustrated, the source and drain contact 126 and fin-type metal-semiconductor resistor 126' may be formed by, for instance, by providing a conductive material over the respective silicide (for instance, silicide 124 and 124') in regions 108 and 110 respectively. The conductive material may be formed by employing one or more conventional deposition processes such as, for example, sputtering, plating, evaporation, chemical vapor deposition (CVD), plasma enhanced chemical vapor deposition (PECVD), chemical solution deposition, atomic layer deposition (ALD) or the like. In one example, the conductive material may be or include a metal such as, for example, tantalum (Ta), tantalum nitride (TaN), titanium (Ti), titanium nitride (TiN), tungsten (W), tungsten nitride (WN) or combinations thereof.

Further as described above in connection with FIG. 1E, where the silicide 124'a is formed on the entire fin (for instance, over the isolated epitaxial semiconductor structure 120'a (see FIG. 1D)), the conductive material disposed over the entire silicide results in defining the fin-type metal resistor having physical properties such as, resistivity and/or temperature coefficient of resistivity which are dominated by the silicide 124'a of the isolated epitaxial semiconductor structure 120'a (see FIG. 1D). By contrast, in another example, where the silicide 124'b is formed at opposite ends of the epitaxial semiconductor structure 120'b, the conductive material disposed over the opposite ends of the epitaxial semiconductor structure 120'b (see FIG. 1D) results in defining the fin-type semiconductor resistor having the physical properties (for instance, resistivity and/or temperature coefficient of resistivity) which are dominated by the doped semiconductor fin material. These two resistors can subsequently be connected in series or in parallel so as to provide the desired resistivity and/or temperature coefficient of resistivity in region 110 of wafer 100.

Additionally, the conductive material may have an inherent temperature coefficient of resistivity which may be either positive or negative, depending upon the conductive material being employed. Further, the fin-type metal resistor formed on isolated epitaxial semiconductor structure 120'a (see FIG. 1D) may have an opposite polarity in its temperature coefficient of resistivity compared to the fin-type semiconductor resistor formed on the merge epitaxial semiconductor structure 120'b (see FIG. 1D). As described above, the dopants, in particular, resistor dopants, implanted within fins 104 define a temperature coefficient of resistivity (for instance, of a material) of fins 104 which, for instance, may be substantially different from the temperature coefficient of resistivity of fins 104 in region 110. The different temperature coefficients of resistivity of the conductive material and doped fins 104 (for instance, including the epitaxial semiconductor structure) provide an effective temperature coefficient of resistivity that is substantially 0 ppm/° C. In one embodiment of the present invention, the dopants implanted within fins 104, for instance, result in defining the temperature coefficient of resistivity as a function of the concentration of the dopants (for instance, resistor dopants) being implanted therein.

Figure 1H:
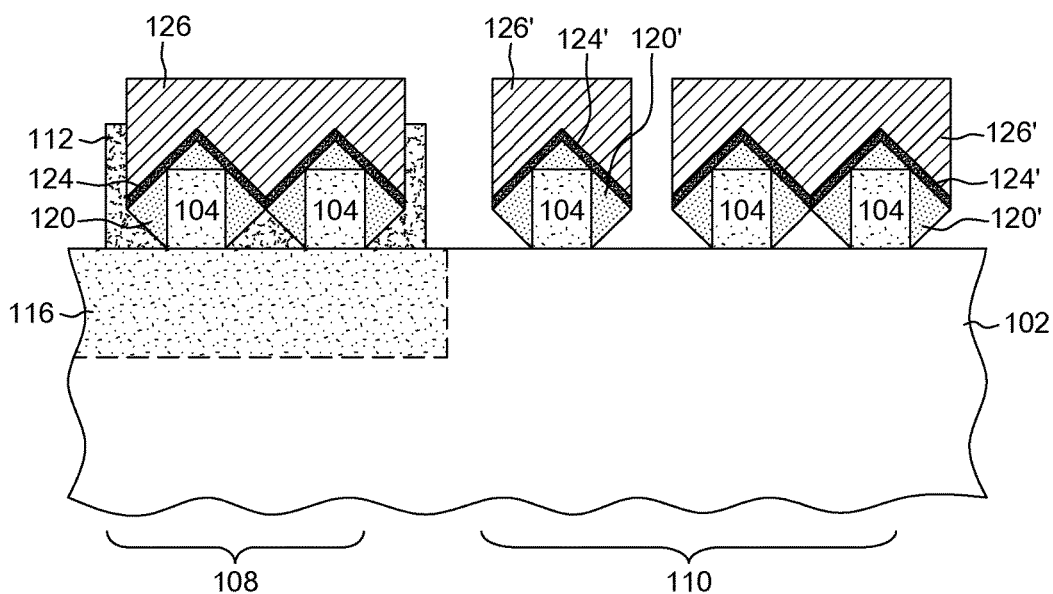
FIG. 1H depicts the intermediate structure of FIG. 1G, taken along line 1H-1H thereof, in accordance with one or more aspects of the present invention.

FIG. 1H depicts a cross-sectional view of the intermediate structure of FIG. 1G, taken along line 1H-1H thereof, and showing source and drain contact 126 in region 108 and, a fin-type metal resistor 126' in region 110 of the wafer 100.

Figure 1I:
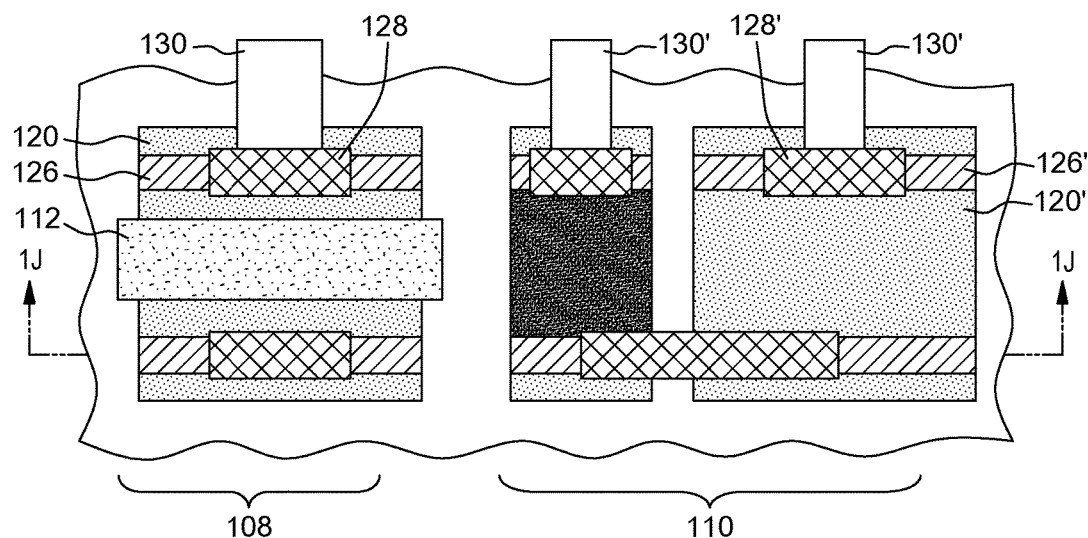
FIG. 1I depicts a plan view of the resultant structure of FIG. 1H, after forming one or more wiring levels of an interconnect structure, in accordance with one or more aspects of the present invention.

FIG. 1I depicts a plan view of the resultant structure of FIG. 1H, after forming one or more wiring levels of an interconnect structure, during subsequent fabrication processing. As one skilled in the art will understand, the wiring levels may include, for instance, horizontal wiring 128 being connected with vertical wiring 130 of the source and drain regions 120 in region 108, while horizontal wiring 128' may be connected with vertical wiring 130' of the fin-type resistor to control the resistances of the resultant fin-type transistor device.

Figure 1J:
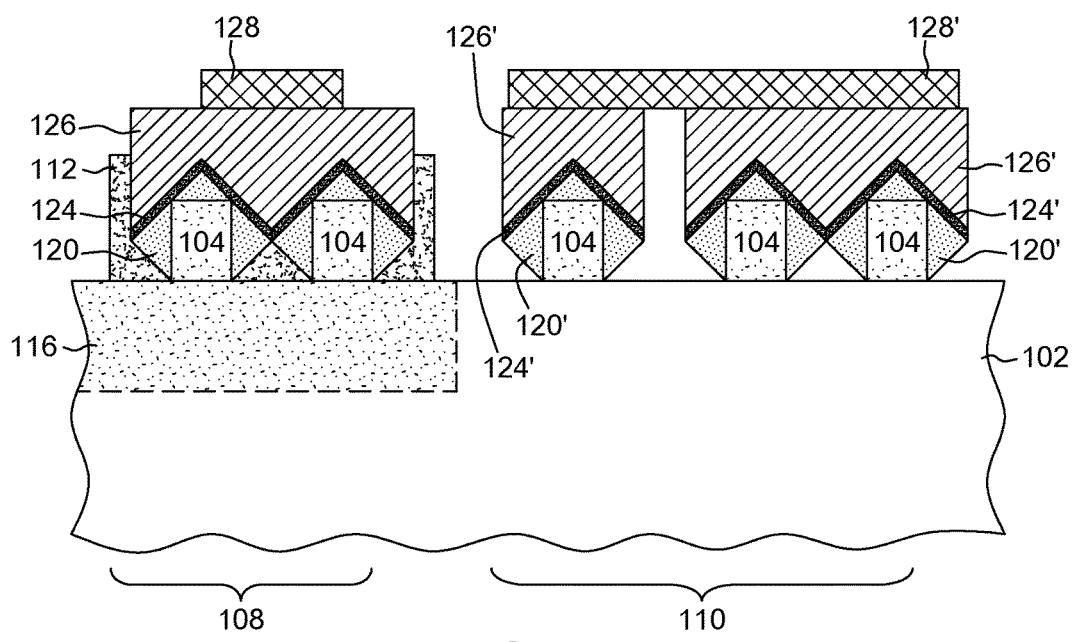
FIG. 1J depicts the resultant structure of FIG. 1I, taken along line 1J-1J, in accordance with one or more aspects of the present invention.

FIG. 1J depicts a cross-sectional view of the resultant structure of FIG. 1J, taken along line 1J-1J, and showing the various horizontal (128 and 128') and vertical wiring levels (130 and 130') of the interconnect structure using metal vias.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of one or more aspects of the invention and the practical application, and to enable others of ordinary skill in the art to understand one or more aspects of the present invention for various embodiments with various modifications as are suited to the particular use contemplated. Furthermore, a device or structure that is configured in a certain way is configured in at least that way, but may also be configured in ways that are not listed.

What is claimed is:

1. A method comprising:
providing a wafer with at least one fin extended above a substrate in a first region, and at least one fin extended above the substrate in a second region of the wafer;
forming a gate structure extending at least partially over the at least one fin in the first region to define a semiconductor device region in the first region;
implanting a dopant into the at least one fin in the first region and into the at least one fin in the second region of the wafer, wherein the implanting of the dopant into the at least one fin of the second region modulates a physical property of the at least one fin to define a resistor device region in the second region; and
disposing a conductive material at least partially over the at least one fin in the first region and over the at least one fin in the second region of the wafer, in part, to form a source and drain contact in the first region, and a fin-type metal-semiconductor resistor in the second region of the wafer.

2. The method of claim 1, further comprising forming the gate structure extending at least partially over the at least one fin in the first region, prior to the implanting of the dopant to define the resistor device region.

3. The method of claim 2, further comprising implanting the dopant into the at least one fin in the first region to define a well dopant in the first region, and implanting the dopant into the at least one fin in the second region to define a resistor dopant in the second region of the wafer.

4. The method of claim 3, wherein the physical property of the at least one fin of the second region comprises a resistivity of the at least one fin of the second region, the resistivity of the at least one fin being a function of the dopant implanted into the at least one fin in the second region.

5. The method of claim 1, further comprising epitaxially growing a semiconductor material to form a source and drain region in the first region, and to form an epitaxial semiconductor structure in the second region of the wafer.

6. The method of claim 5, further comprising implanting the dopant into the at least one fin in the second region, subsequent to the epitaxial growth, to modulate the physical property of the at least one fin in the second region.

7. The method of claim 6, further comprising implanting the dopant into the at least one fin in the first region to define a source and drain dopant in the first region, and implanting the dopant into the at least one fin in the second region to define a resistor dopant in the second region.

8. The method of claim 1, wherein the implanting comprises performing a first implantation and a second implantation into the at least one fin in the second region, the first implantation being performed subsequent to the defining the semiconductor device region in the first region, and the second implantation being performed subsequent to forming an epitaxial semiconductor structure in the second region.

9. The method of claim 1, wherein the physical property of the at least one fin in the second region comprises a temperature coefficient of resistivity, the temperature coefficient of resistivity of the at least one fin in the second region being a function of the dopant implanted within the at least one fin in the second region.

10. The method of claim 9, wherein the conductive material disposed over the at least one fin in the second region has a first temperature coefficient of resistivity, and the at least one fin, upon implantation of the dopant, has a second temperature coefficient of resistivity, the first and the second coefficients of resistivity being different temperature coefficients of resistivity.

11. The method of claim 9, wherein the dopant being implanted into the at least one fin in the second region modulates an effective temperature coefficient of resistivity to be substantially 0 ppm/° C.

12. The method of claim 9, wherein the conductive material resides over and in electrical contact with a silicide, the silicide residing over or comprising part of an epitaxial semiconductor structure disposed over the at least one fin in the second region.

13. The method of claim 12, wherein the epitaxial semiconductor structure comprises an isolated epitaxial semiconductor structure over the at least one fin in the second region, and the silicide is formed over the isolated epitaxial semiconductor structure along a length thereof defining a fin-type metal resistor in the second region of the wafer.

14. The method of claim 12, wherein the epitaxial semiconductor structure comprises at least a partially merged epitaxial semiconductor structure over the at least one fin in the second region, and the silicide is formed, at least in part, over the at least the partially merged epitaxial semiconductor structure in the second region of the wafer defining a fin-type semiconductor resistor in the second region of the wafer.

15. The method of claim 1, wherein the dopant comprises at least one of an n-type dopant or a p-type dopant, wherein a concentration of the dopant within the at least one fin is within a range of about 1e16 atom/$cm^3$ to 1e20/$cm^3$.

* * * * *